US010930571B2

(12) United States Patent
Lee et al.

(10) Patent No.: US 10,930,571 B2
(45) Date of Patent: Feb. 23, 2021

(54) TEST STRUCTURE AND EVALUATION METHOD FOR SEMICONDUCTOR PHOTO OVERLAY

(71) Applicant: Samsung Electronics Co., Ltd., Suwon-si (KR)

(72) Inventors: Ki-Don Lee, Austin, TX (US); Zack Tran Mai, Austin, TX (US)

(73) Assignee: SAMSUNG ELECTRONICS CO., LTD.

(*) Notice: Subject to any disclaimer, the term of this patent is extended or adjusted under 35 U.S.C. 154(b) by 0 days.

(21) Appl. No.: 16/394,924

(22) Filed: Apr. 25, 2019

(65) Prior Publication Data

US 2020/0251391 A1    Aug. 6, 2020

Related U.S. Application Data

(60) Provisional application No. 62/800,387, filed on Feb. 1, 2019.

(51) Int. Cl.
*H01L 21/66* (2006.01)
*G01R 31/26* (2020.01)
*G03F 7/20* (2006.01)

(52) U.S. Cl.
CPC .......... *H01L 22/32* (2013.01); *G01R 31/2644* (2013.01); *G03F 7/70633* (2013.01); *H01L 22/12* (2013.01)

(58) Field of Classification Search
CPC .. G01R 31/26; G01R 31/264; G01R 31/2644; H01L 22/12; H01L 22/32
USPC .......................................................... 257/48
See application file for complete search history.

(56) References Cited

U.S. PATENT DOCUMENTS

| | | | |
|---|---|---|---|
| 6,448,098 | B1 | 9/2002 | Milor |
| 7,538,443 | B2 | 5/2009 | Amato |
| 8,592,287 | B2 | 11/2013 | Shih et al. |
| 2019/0006289 | A1* | 1/2019 | Huang ................ H01L 23/5283 |

* cited by examiner

*Primary Examiner* — Monica D Harrison
(74) *Attorney, Agent, or Firm* — Renaissance IP Law Group LLP

(57) ABSTRACT

A method for detecting overlay misalignment of a semiconductor device uses a test structure that includes a sensor structure and a via-chain structure. The sensor structure is disposed in a first layer on a semiconductor substrate and includes a plurality of first conductive lines extending in a first direction. Each first conductive line is separated from an adjacent first conductive line in a second direction by a first space. The via-chain structure is in a second layer above the first layer and between the first layer and the second layer. The via-chain structure includes at least one second conductive line disposed in the second layer and at least one via electrically connected to each second conductive line and extending toward the first layer. The at least one via is disposed in the first space between the adjacent first conductive lines of the sensor structure.

13 Claims, 6 Drawing Sheets

VIEW B-B'
FIG. 1B

VIEW C-C'
FIG. 1C

TEST STRUCTURE AND EVALUATION METHOD FOR SEMICONDUCTOR PHOTO OVERLAY

CROSS-REFERENCE TO RELATED APPLICATION

This patent application claims the priority benefit under 35 U.S.C. § 119(e) of U.S. Provisional Patent Application No. 62/800,387, filed on Feb. 1, 2019, the disclosure of which is incorporated herein by reference in its entirety.

TECHNICAL FIELD

The subject matter disclosed herein generally relates to detecting photo overlay misalignment for a semiconductor device. More particularly, the subject matter disclosed herein relates to a structure and a method for detecting photo overlay misalignment for a semiconductor device.

BACKGROUND

Control of photo overlay is important for semiconductor reliability. A typical approach for adjusting photo overlay, such as a box-on-box technique, uses an alignment pattern in which an overlay between successive patterned layers may be optically measured. The current overlay detection techniques, however, are generally not designed for detecting reliability risk. That is, the current techniques are able to measure an average overlay, but are unable to provide a measure of the worst case overlay between successive patterned layers of a semiconductor device.

SUMMARY

An example embodiment provides a test structure for detecting overlay misalignment of a semiconductor device in which the test structure may include a sensor structure and a via-chain structure. The sensor structure may be disposed in a first layer on a semiconductor substrate, and the sensor structure may include a plurality of first conductive lines extending in a first direction in which each first conductive line may be separated from an adjacent first conductive line in a second direction by a first space, and in which the second direction may be substantially perpendicular to the first direction. The via-chain structure may be disposed in a second layer above the first layer and between the first layer and the second layer. The via-chain structure comprising at least one second conductive line disposed in the second layer and at least one via electrically connected to each second conductive line and extending toward the first layer, the at least one via being disposed in the first space between the adjacent first conductive lines of the sensor structure. In one embodiment, the sensor structure may include two first conductive lines in which the via-chain structure may further include a plurality of first conductive segments disposed in the first layer in the first space between adjacent first conductive lines of the sensor structure, the at least one second conductive line may include a plurality of second conductive segments, and the at least one via may electrically connect the first conductive segments to the second conductive segments. In another embodiment, the sensor structure may include three conductive lines in which the via-chain structure may further include a plurality of first conductive segments disposed in the first layer in the first space between each adjacent first conductive line of the sensor structure, the at least one second conductive line may include a plurality of second conductive segments, and the at least one via may electrically connect the first conductive segments to the second conductive segments.

Another example embodiment provides a test structure for detecting overlay misalignment of a semiconductor device in which the test structure may include a plurality of pairs of a first conductive structure and a second conductive structure in which the first conductive structure of a pair may be disposed in a first layer on a semiconductor substrate and may include a plurality of first conductive lines extending in a first direction in which each first conductive line may be separated from an adjacent conductive line in a second direction by a first space in which the second direction may be substantially perpendicular to the first direction. The second conductive structure of the pair may be disposed in a second layer above the first layer and between the first layer and the second layer in which the second conductive structure of the pair may include at least one second conductive line disposed in the second layer and at least one via electrically connected to each second conductive line and extending toward the first layer. The at least one via may be disposed in the first space between adjacent first conductive lines of the first conductive structure. A first pair may include at least one via of the second conductive structure that is substantially centered between adjacent first conductive lines of the first conductive structure of the first pair, and the second pair may include at least one via of the second conductive structure that is offset substantially a first predetermined distance in the second direction with respect to the first conductive lines of the first conductive structure of the second pair.

Still another example embodiment provides a method for detecting overlay misalignment of a semiconductor device in which the method may include: forming a test structure comprising a pair of a sensor structure and a via-chain structure by forming the sensor structure in a first layer on a semiconductor substrate and the via-chain structure in a second layer that is above the first layer and between the first layer and the second layer, the sensor structure comprising a plurality of first conductive lines extending in a first direction, each first conductive line being separated from another first conductive line in a second direction by a first space, the second direction being substantially perpendicular to the first direction, and the via-chain structure comprising at least one second conductive line and at least one via that is electrically connected to the at least one second conductive line, the at least one via being disposed in the first space between adjacent first conductive lines of the sensor structure; and determining an overlay misalignment between the first layer and the second layer based on detecting a short between the sensor structure and the via-chain structure.

BRIEF DESCRIPTION OF THE DRAWINGS

In the following section, the aspects of the subject matter disclosed herein will be described with reference to exemplary embodiments illustrated in the figures, in which.

DETAILED DESCRIPTION

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not be necessarily all referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing particular exemplary embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement the teachings of particular embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to the subject matter disclosed herein, a test structure and a method using the test structure provides a way for detecting a worst case overlay between successive patterned layers of a semiconductor device, thereby improving the reliability of the finished semiconductor device. In one embodiment, measurements of the worst case overlay may be collected inline after, for example, a metallization step to provide fast and accurate feedback of the reliability of a semiconductor device during fabrication.

Figures 1, 1A:
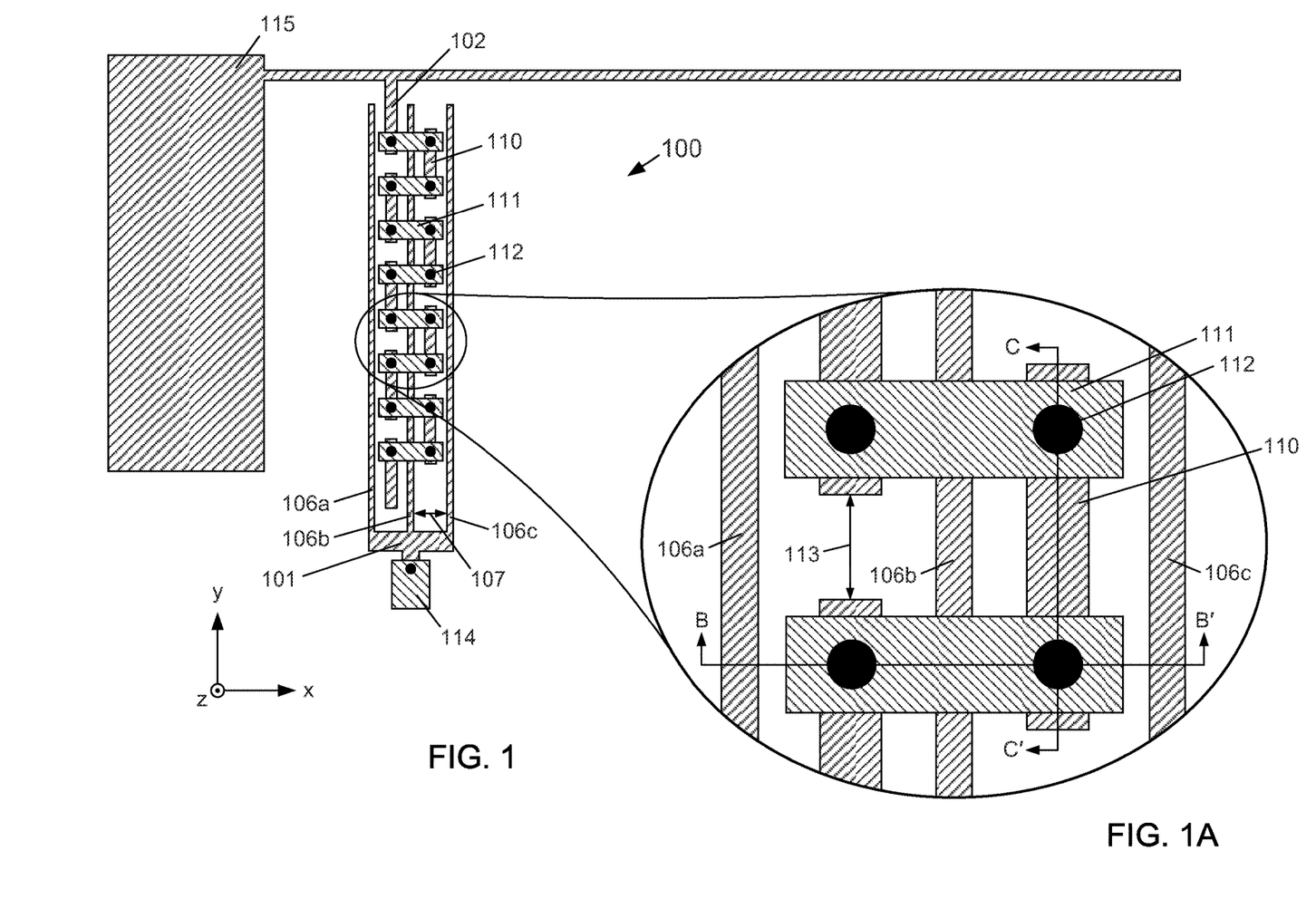
FIG. 1 depicts a plan view of a basic configuration of a first example embodiment of a test structure for detecting overlay misalignment of a semiconductor device according to the subject matter disclosed herein.
FIG. 1A depicts an enlarged area of a portion of the test structure depicted in FIG. 1.
Figure 1B:
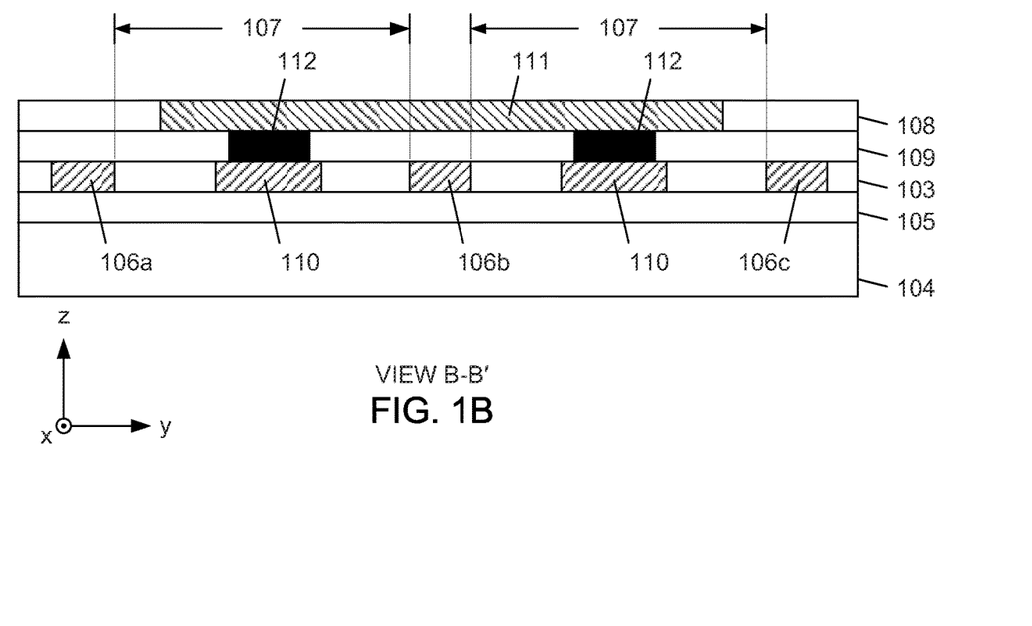
FIG. 1B depicts a cross-sectional view of the test structure depicted in FIG. 1 taken along line B-B' in FIG. 1A.
Figure 1C:
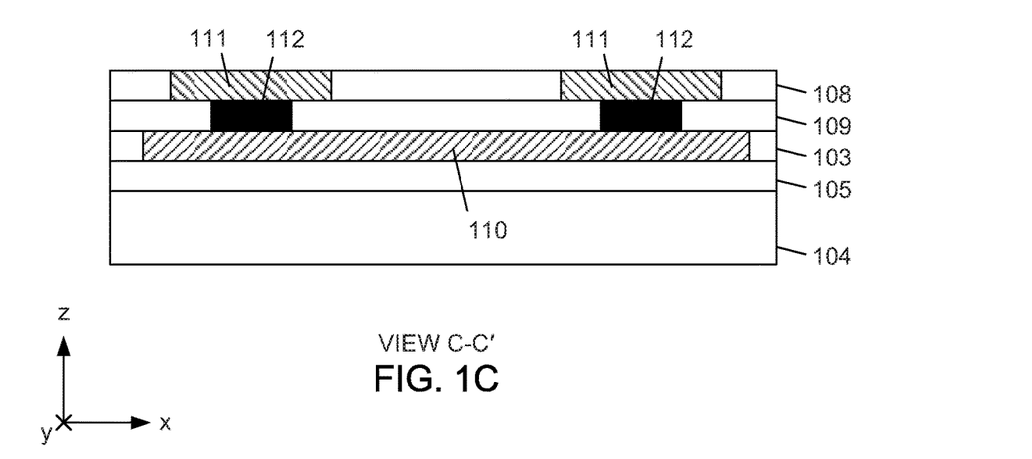
FIG. 1C depicts a cross-sectional view of the test structure depicted in FIG. 1 taken along line C-C' in FIG. 1A.

FIG. 1 depicts a plan view of a basic configuration of a first example embodiment of a test structure 100 for detecting overlay misalignment of a semiconductor device according to the subject matter disclosed herein. FIG. 1A depicts an enlarged area of a portion of the test structure 100. FIG. 1B depicts a cross-sectional view of the test structure 100 taken along line B-B' in FIG. 1A. FIG. 1C depicts a cross-sectional view of the test structure 100 taken along line C-C' in FIG. 1A.

With reference to FIGS. 1-1C, the basic configuration of the test structure 100 may include a sensor structure 101 and a via-chain structure 102 that are paired together. The sensor structure 101 may be disposed in a first layer 103 on a semiconductor substrate 104. There may be one or more layers 105 between the first layer 103 and the semiconductor substrate 104. There may also be additional layers formed above the first layer 103.

The sensor structure 101 may include a plurality of conductive lines 106 that extend in a given direction. For the particular example embodiment depicted in FIG. 1, the sensor structure includes three conductive lines 106a-106C that each extend, for example, in a direction that is substantially parallel to the y-axis. Other embodiments may include two conductive lines 106. (See, for example, test structure 300 in FIG. 3.) Still other embodiments may include more than three conductive lines 106. Each conductive line 106 of a sensor structure 101 may be separated from an adjacent conductive line by a space 107 in a direction that is substantially perpendicular to the direction that the conductive lines 106 extend. For example, as depicted in FIG. 1, the conductive lines 106 are spaced from each other in a direction that is substantially parallel to the x-axis.

The via-chain structure 102 may be disposed in the first layer 103 and a second layer 108 that is above the first layer 103 (i.e., in the z-axis direction). The second layer 108 may be on a layer 109, which may be on the first layer 103. The via-chain structure 102 may include a plurality of conductive segments 110 that are disposed in the first layer 103, a plurality of conductive segments 111 that are disposed in the second layer 108, and a plurality of vias 112 that electrically connect the conductive segments 110 to the conductive segments 111.

The conductive segments 110 may be positioned in the space 107 between adjacent conductive lines 106 of the sensor structure 101. In particular, the conductive segments 110 are arranged substantially in a line extending in a direction that is substantially parallel to the y-axis and are disposed between the two spaces 107 between the conductive lines 106. Each conductive segment 110 may be separated from an adjacent conductive segment 110 by a second space 113 (FIG. 1A). The conductive segments 111 extend in a direction that is substantially parallel to the x-axis between the conductive segments 110.

A plurality of vias 112 electrically connect the conductive segments 110 to the conductive segments 111 to form a via chain. The example configuration of the via-chain structure 102 depicted in FIG. 1 includes a serpentine shape between the two spaces 107 (i.e., along the x-axis) and a serpentine shape between the first layer 103 and the second layer 108 (FIGS. 1B and 1C).

The conductive lines 106, the conductive segments 110, the conductive segments 111 and the vias 112 may be formed of a conductive material, such as, but not limited to, copper, aluminum and tungsten. The sensor structure 101 may be connected to a pad 114, and the via-chain structure 102 may be connected to a pad 115.

Figure 3:
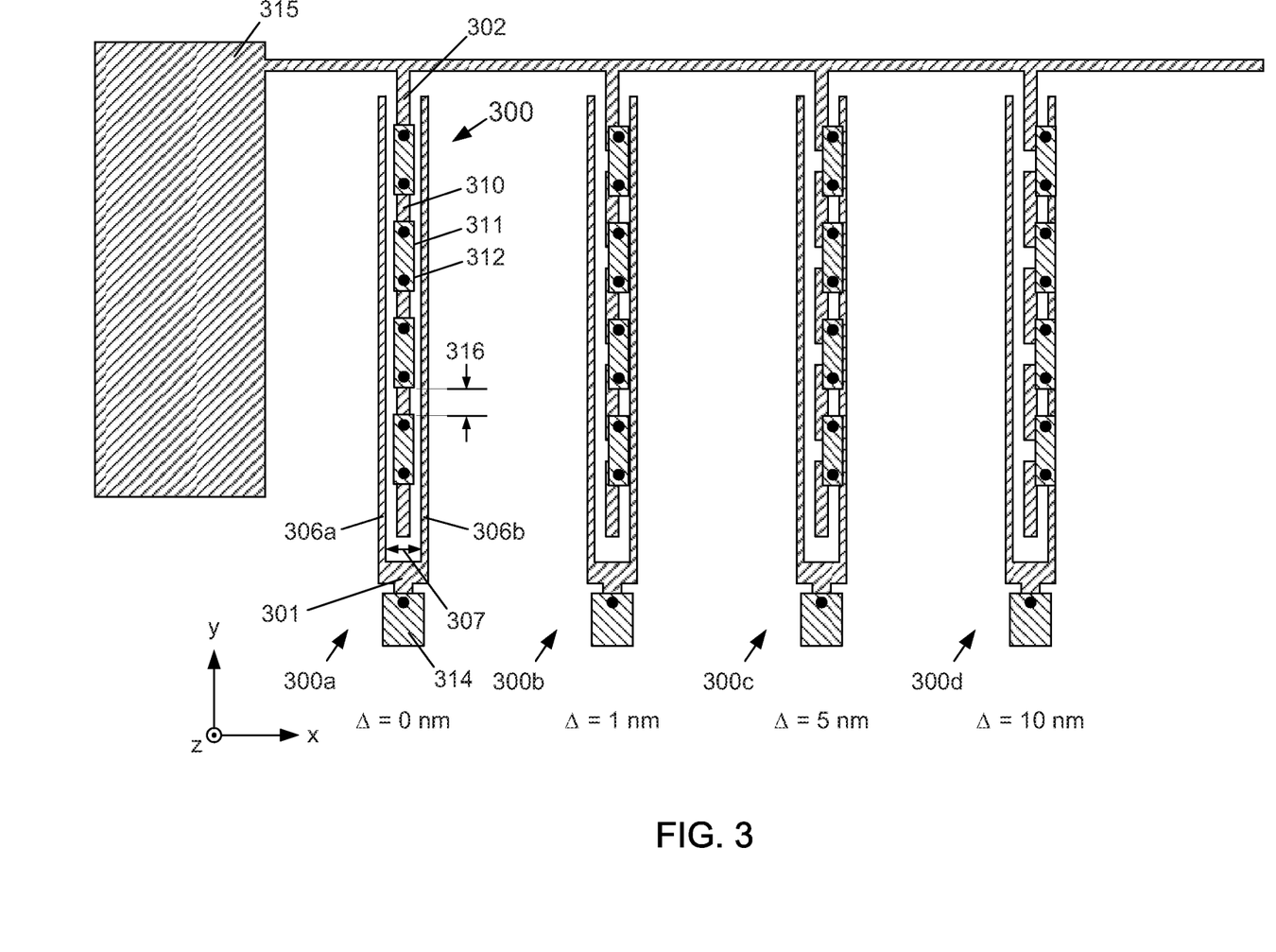
FIG. 3 depicts a plan view of a basic configuration of a second example embodiment of a test structure and a second example of an arrangement of test structures for detecting overlay misalignment of a semiconductor device according to the subject matter disclosed herein.

FIG. 3 depicts a plan view of a basic configuration of a second example embodiment of a test structure 300a for detecting overlay misalignment of a semiconductor device according to the subject matter disclosed herein. The basic configuration of the test structure 300a differs from the basic configuration of the test structure 100 only having a serpentine shape between the first layer and the second layer. The via-chain structure of the test structure 300a is substantially linear as viewed in the plan view of FIG. 3.

The test structure 300 may include a sensor structure 301 and a via-chain structure 302 that are paired together. The sensor structure 301 may be disposed in a first layer (i.e., layer 103 in FIGS. 1B and 1C) on a semiconductor substrate. The sensor structure 301 may include two conductive lines 306a and 306b that each extend, for example, in a direction that is substantially parallel to the y-axis. Each conductive line 306 may be separated by a spacing 307 from an adjacent conductive line in a direction that is substantially perpendicular to the direction that the conductive lines 306 extend. As depicted in FIG. 3, the conductive lines 306 are spaced from each other in a direction that is substantially parallel to the x-axis.

The via-chain structure 302 may be disposed in the first layer and a second layer that is above the first layer. (See FIGS. 1B and 1C.) The via-chain structure 302 may include a plurality of conductive segments 310 that are disposed in the first layer, a plurality of conductive segments 311 that are disposed in the second layer, and a plurality of vias 312 that electrically connect the conductive segments 310 to the conductive segments 311.

The plurality of conductive segments 310 may be positioned in the space 307 between the two conductive lines 306a and 306b. The adjacent conductive segments 310 may be separated by a space similar to the space 113 in FIG. 1A.

The conductive segments 311 may be arranged substantially in a line extending in a direction that is substantially parallel to the y-axis, and may also be separated by a space similar to the space 113. Each conductive segment 311 may separated from an adjacent conductive segment 311 by a space 316. The conductive segments 311 may be arranged in the second layer above a space between two conductive segments 311 in the first layer.

The conductive lines 306, the conductive segments 310, the conductive segments 311 and the vias 312 may be formed of a conductive material, such as, but not limited to, copper, aluminum and tungsten. The sensor structure 301 may be connected to a pad 314, and the via-chain structure 302 may be connected to a pad 315.

In one embodiment, the via-chain structure may include a single conductive line from which at least one via extends from the second layer toward the first layer and in which the at least one via is positioned between the conductive lines of a sensor structure. In this embodiment, the via-chain structure would not include any conductive lines or segments in the first layer.

Figure 2:
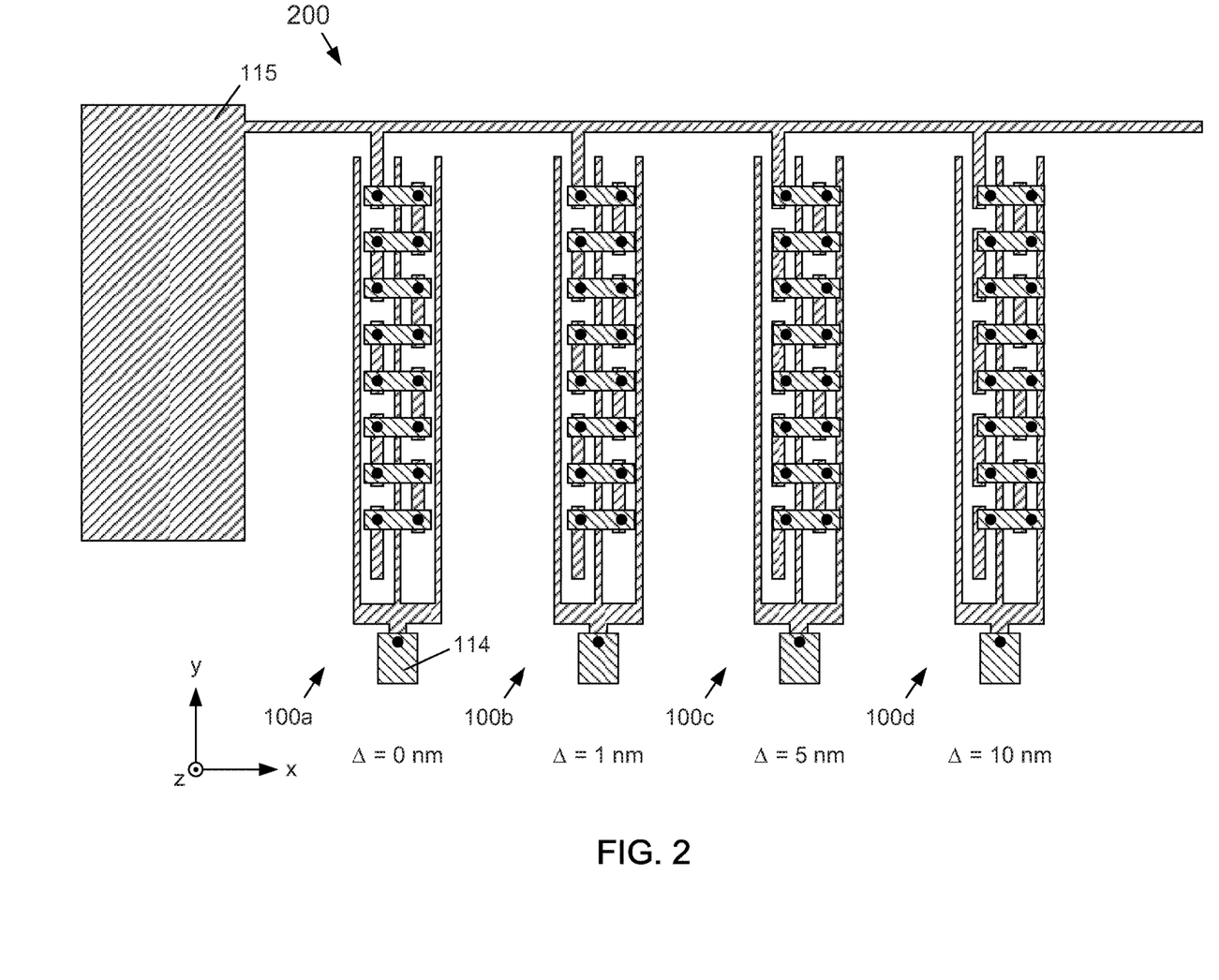
FIG. 2 depicts a plan view of an arrangement of a plurality of the test structures for detecting overlay misalignment of a semiconductor device according to the subject matter disclosed herein.

FIG. 2 depicts a plan view of an arrangement 200 of a plurality of the test structures 100a-100d for detecting overlay misalignment of a semiconductor device according to the subject matter disclosed herein. Each of the test structures 100a-100d includes the basic configuration of the test structure 100 depicted in FIG. 1. The arrangement 200 provides a direct measurement of overlay misalignment between layers of a semiconductor device. Although only four test structures are depicted in FIG. 2, any number of test structures may be used.

The test structure 100a includes a via-chain structure 102 that is substantially centered in the space 107 between the conductive lines of the sensor structure 101. There is no intentional offset in the x-axis direction between the via-chain structure 102 and the sensor structure 101.

The test structures 100b-100d each include a respectively different intentional offset in the x-axis direction between the via-chain structure 102 and the sensor structure 101. For example, the test structure 100b may include an intentional offset of +1 nm (i.e., $\Delta=1$ nm) in the +x direction. The test structure 100c may include an intentional offset of +5 nm (i.e., $\Delta=5$ nm) in the +x direction. The test structure 100d may include an intentional offset of +10 nm (i.e., $\Delta=10$ nm) in the +x direction.

The intentional offsets permit that the overlay misalignment may be directly measured, thereby providing the worst case overlay misalignment between the two layers. After the layer (i.e., the second layer 108 in FIGS. 1B and 1C) that includes the conductive segments 111 of the via-chain structure 102 has been formed, the overlay misalignment of the layers containing the sensor structure 101 and the via-chain structure 102 may be checked either optically or electrically.

In one embodiment in which n test structures 100 are used and in which the offset of the via-chain structure varies uniformly across the test structure, the spacing h of adjacent the via structures 102 with respect to each other may be determined as $$h = m + (i \times \Delta) \quad (1)$$

in which n is an integer and equals the number of total test structures 100, m is a constant distance value, $\Delta$ is a constant delta value, and $i \in \{1, \ldots, n\}$.

FIG. 3 depicts a plan view of an arrangement 300 of a plurality of the test structures 300a-300d for detecting overlay misalignment of a semiconductor device according to the subject matter disclosed herein. Each of the test structures 300a-300d includes the basic configuration of the test structure 300. The arrangement 300 provides a direct measurement of overlay misalignment between layers of a semiconductor device. Although only four test structures are depicted in FIG. 3, any number of test structures may be used.

The test structure 300a includes a via-chain structure 302 that is substantially centered in the space 307 between the conductive lines of the sensor structure 301. There is no intentional offset in the x-axis direction between the via-chain structure 302 and the sensor structure 301. The test structures 300b-300d each include a respectively different intentional offset in the x-axis direction between the via-chain structure 302 and the sensor structure 300. For example, the test structure 300b may include an intentional offset of +1 nm (i.e., Δ=1 nm) in the +x direction. The test structure 300c may include an intentional offset of +5 nm (i.e., Δ=5 nm) in the +x direction. The test structure 300d may include an intentional offset of +10 (i.e., Δ=10 nm) nm in the +x direction. In one embodiment, Eq. (1) may be used to determine the offset of the via-chain structure 302 with respect to an adjacent via-chain structure.

To measure the overlay misalignment electrically, a voltage may be applied to the pad 115 (FIG. 1), and the applied voltage may be detected at a pad 114. If the actual misalignment causes short between the vias 112 and a conductive line 106 of a sensor structure 101, the voltage applied to the pad 115 may be detected by micro-probing at one or more of the pads 114. Alternatively, a voltage may separately be applied to each of the pads 114 and detected at the pad 115. In yet another embodiment, a ramping voltage may be used. In still another embodiment, a scanning electron microscope (SEM) may be used to apply a charge to the pad 115, which then may be detected at the pads 114 if there is a short. Alternatively, a short may be visually detected by a metal-charging effect caused by using an SEM to charge the pad 115.

Figure 4:
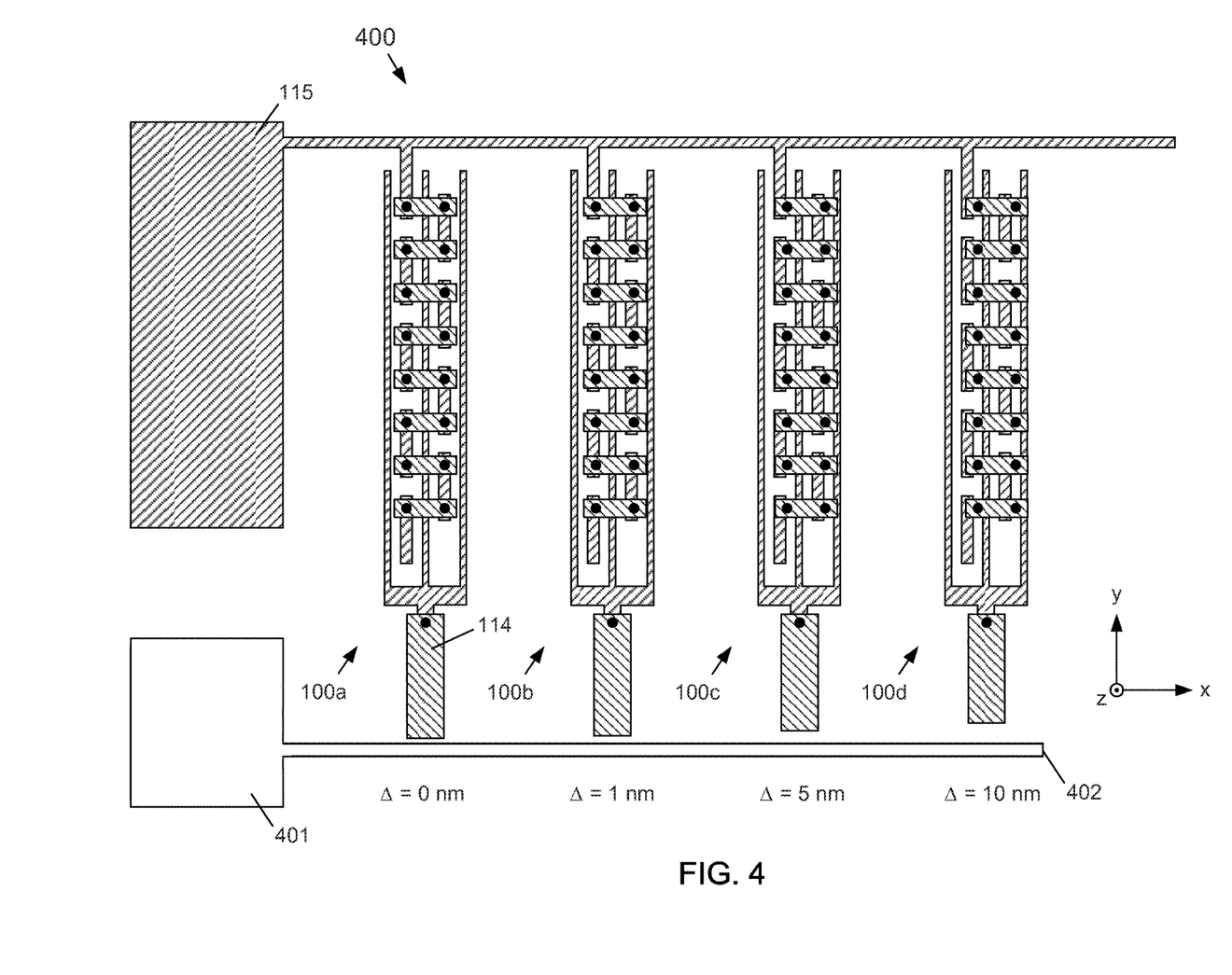
FIG. 4 depicts a plan view of an arrangement of a plurality of the test structures for detecting overlay misalignment of a semiconductor device according to the subject matter disclosed herein.

FIG. 4 depicts a plan view of an example arrangement 400 of a plurality of the test structures 100a-100d for detecting overlay misalignment of a semiconductor device according to the subject matter disclosed herein. The arrangement 400 includes a pad 401 and a conductive line 402. Each of the test structures 100a-110d includes a pad 114 that extends toward the conductive line 402 a different amount so that the respective pads 114 are spaced apart from the conductive line 402 by varying distances. For this embodiment, a ramping test voltage may be applied to the pad 115 and if there is a short between a via 112 and a conductive line 106 of a test structure 100, the ramping voltage may be detected at the pad 401. The varying distances of the pads 114 from the conductive line 402 may be determined at design time.

Figure 5:
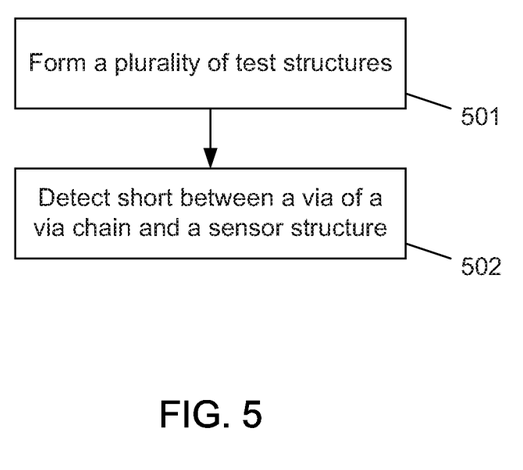
FIG. 5 depicts a flowchart of a method 500 for detecting overlay misalignment of a semiconductor device according to the subject matter disclosed herein.

FIG. 5 depicts a flowchart of a method 500 for detecting overlay misalignment of a semiconductor device according to the subject matter disclosed herein. At 501, a plurality of test structures is formed in first and second layers of a semiconductor device. The test structures may have one of the basic configurations depicted in FIG. 1 or FIG. 3. At 502, a short is detected between a via-chain structure 102 and a sensor structure 101. In one embodiment, a voltage may be applied to the pad of a via-chain structure, and the applied voltage may be detected at a pad 114. Alternatively, a ramping voltage may be used to detect a breakdown between a via and a sensor structure. As yet another alternatively, an SEM may be used to apply a charge to the pad of a via-chain structure, which may be detected at a pad of a sensor structure.

As will be recognized by those skilled in the art, the innovative concepts described herein can be modified and varied over a wide range of applications. Accordingly, the scope of claimed subject matter should not be limited to any of the specific exemplary teachings discussed above, but is instead defined by the following claims.

What is claimed is:

1. A test structure for detecting overlay misalignment of a semiconductor device, the test structure comprising:
    a sensor structure disposed in a first layer on a semiconductor substrate, the sensor structure comprising a plurality of first conductive lines extending in a first direction, each first conductive line being separated from an adjacent first conductive line in a second direction by a first space, the second direction being substantially perpendicular to the first direction; and
    a via-chain structure in a second layer above the first layer and between the first layer and the second layer, the via-chain structure comprising at least one second conductive line disposed in the second layer and at least one via electrically connected to each second conductive line and extending toward the first layer, the at least one via being disposed in the first space between the adjacent first conductive lines of the sensor structure,
    wherein the sensor structure comprises two first conductive lines,
    wherein the via-chain structure further comprises a plurality of first conductive segments disposed in the first layer in the first space between adjacent first conductive lines of the sensor structure,
    wherein the at least one second conductive line comprises a plurality of second conductive segments, and
    wherein the at least one via electrically connects the first conductive segments to the second conductive segments.

2. The test structure of claim 1, wherein the plurality of first conductive segments is arranged substantially in a line extending substantially in the first direction, each first conductive segment being separated from an adjacent first conductive segment by a second space,
    wherein the plurality of second conductive segments is arranged substantially in a line extending substantially in the first direction, each second conductive segment being separated from an adjacent second conductive segment by a third space, and at least one second conductive segment being arranged in the second layer above a second space in the first layer.

3. The test structure of claim 2, further comprising a plurality of sensor structures and a plurality of via-chain structures, each sensor structure being paired with a corresponding via-chain structure,
    wherein a first pair comprises at least one via of the via-chain structure that is substantially centered in between the two first conductive lines of the sensor structure of the first pair, and
    wherein a second pair comprises at least one via of the via chain structure that is offset substantially a first predetermined distance in the second direction with respect to the two first conductive lines of the sensor structure of the second pair.

4. The test structure of claim 3, wherein a third pair comprises at least one via of the via-chain structure that is offset substantially a second predetermined distance in the second direction with respect to the two first conductive lines of the sensor structure of the third pair, the second predetermined distance being greater than the first predetermined distance.

5. A test structure for detecting overlay misalignment of a semiconductor device, the test structure comprising:
    a sensor structure disposed in a first layer on a semiconductor substrate, the sensor structure comprising a plurality of first conductive lines extending in a first direction, each first conductive line being separated from an adjacent first conductive line in a second direction by a first space, the second direction being substantially perpendicular to the first direction; and a via-chain structure in a second layer above the first layer and between the first layer and the second layer, the via-chain structure comprising at least one second conductive line disposed in the second layer and at least one via electrically connected to each second conductive line and extending toward the first layer, the at least one via being disposed in the first space between the adjacent first conductive lines of the sensor structure, wherein the sensor structure comprises three conductive lines, wherein the via-chain structure further comprises a plurality of first conductive segments disposed in the first layer in the first space between each adjacent first conductive line of the sensor structure, wherein the at least one second conductive line comprises a plurality of second conductive segments, and wherein the at least one via electrically connects the first conductive segments to the second conductive segments.

6. The test structure of claim 5, wherein the second conductive segments extend in the second direction between the first conductive segments.

7. The test structure of claim 6, further comprising a plurality of sensor structures and a plurality of via-chain structures, each sensor structure being paired with a corresponding via-chain structure, wherein a first pair comprises at least one via of the via-chain structure that is substantially centered between the first conductive lines of the sensor structure of the first pair, wherein a second pair comprises at least one via of the via-chain structure that is offset substantially a first predetermined distance in the second direction with respect to the first conductive lines of the sensor structure of the second pair.

8. The test structure of claim 7, wherein a third pair comprises at least one via of the via-chain structure that is offset substantially a second predetermined distance in the second direction with respect to the first conductive lines of the sensor structure of the third pair, the second predetermined distance being greater than the first predetermined distance.

9. A test structure for detecting overlay misalignment of a semiconductor device, the test structure comprising:

a plurality of pairs of a first conductive structure and a second conductive structure, the first conductive structure of a pair being disposed in a first layer on a semiconductor substrate and comprising a plurality of first conductive lines extending in a first direction, each first conductive line being separated from an adjacent conductive line in a second direction by a first space, the second direction being substantially perpendicular to the first direction, and the second conductive structure of the pair being disposed in a second layer above the first layer and between the first layer and the second layer, the second conductive structure of the pair comprising at least one second conductive line disposed in the second layer and at least one via electrically connected to each second conductive line and extending toward the first layer, the at least one via being disposed in the first space between adjacent first conductive lines of the first conductive structure, a first pair comprising at least one via of the second conductive structure that is substantially centered between adjacent first conductive lines of the first conductive structure of the first pair, and a second pair comprising at least one via of the second conductive structure that is offset substantially a first predetermined distance in the second direction with respect to the first conductive lines of the first conductive structure of the second pair.

10. The test structure of claim 9, further comprising a third pair comprising at least one via of the second conductive structure that is offset substantially in a second predetermined distance in the second direction with respect to the first conductive lines of the first conductive structure of the third pair, the second predetermined distance being greater than the first predetermined distance.

11. The test structure of claim 10, wherein at least one pair of the plurality of pairs comprises a first conductive structure having two first conductive lines, wherein the second conductive structure further comprises a plurality of first conductive segments disposed in the first layer in the first space between adjacent first conductive lines of the first conductive structure, wherein the at least one second conductive line comprises a plurality of second conductive segments, and wherein the at least one via electrically connects the first conductive segments to the second conductive segments.

12. The test structure of claim 11, wherein the plurality of first conductive segments of the at least one pair is arranged substantially in a line extending in the first direction, each first conductive segment being separated from an adjacent first conductive segment by a second space, wherein the plurality of second conductive segments of the at least one pair is arranged substantially in a line extending in the first direction, each second conductive segment being separated from an adjacent second conductive segment by a third space, and at least one second conductive segment arranged in the second layer above a second space in the first layer of the at least one pair.

13. The test structure of claim 10, wherein at least one pair comprises a first conductive structure having three conductive lines, wherein the second conductive structure further comprises a plurality of first conductive segments disposed in the first layer in the first space between each adjacent first conductive line of the first conductive structure, wherein the at least one second conductive line comprises a plurality of second conductive segments, and wherein the at least one via electrically connects the first conductive segments to the second conductive segments.

* * * * *